(12) United States Patent
Kawanishi

(10) Patent No.: US 9,279,924 B2
(45) Date of Patent: Mar. 8, 2016

(54) COLOR FILTER SUBSTRATE AND METHOD FOR PRODUCING SAME

(71) Applicant: Sharp Kabushiki Kaisha, Osaka (JP)

(72) Inventor: Takafumi Kawanishi, Osaka (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 0 days.

(21) Appl. No.: 14/421,251

(22) PCT Filed: Aug. 14, 2013

(86) PCT No.: PCT/JP2013/071900
§ 371 (c)(1),
(2) Date: Feb. 12, 2015

(87) PCT Pub. No.: WO2014/030581
PCT Pub. Date: Feb. 27, 2014

(65) Prior Publication Data
US 2015/0205019 A1 Jul. 23, 2015

(30) Foreign Application Priority Data
Aug. 21, 2012 (JP) .................. 2012-182499

(51) Int. Cl.
*G02B 5/20* (2006.01)
*G02B 5/22* (2006.01)
*G02F 1/1335* (2006.01)
*G03F 7/16* (2006.01)
*G03F 7/30* (2006.01)
*G03F 7/00* (2006.01)
*G03F 7/095* (2006.01)

(52) U.S. Cl.
CPC .............. *G02B 5/223* (2013.01); *G02B 5/201* (2013.01); *G02F 1/133516* (2013.01); *G03F 7/0007* (2013.01); *G03F 7/095* (2013.01); *G03F 7/16* (2013.01); *G03F 7/30* (2013.01)

(58) Field of Classification Search
CPC . G03F 7/0007; G03F 1/133516; G02B 5/223; G02B 5/201
USPC ................................ 430/7; 349/106
See application file for complete search history.

(56) References Cited

U.S. PATENT DOCUMENTS

2003/0224255 A1* 12/2003 Fujimori ........... G02F 1/133514
430/7

FOREIGN PATENT DOCUMENTS

| JP | 4-123005A * | 2/1992 |
| JP | 2006-162882A | 6/2006 |
| JP | 2009-69726A | 4/2009 |
| JP | 2009-145650A | 7/2009 |
| JP | 2009-145910A | 7/2009 |
| JP | 2009-251499A | 10/2009 |

(Continued)

*Primary Examiner* — John A McPherson
(74) *Attorney, Agent, or Firm* — Chen Yoshimura LLP

(57) ABSTRACT

Provided are: a color filter substrate that can improve the uniformity of thickness of color filters, and a method of manufacturing the color filter substrate. The method of manufacturing a color filter substrate includes: forming a plurality of photoresist films in layers on a transparent substrate; exposing said plurality of photoresist films via a photomask; forming a pattern having an opening by developing the plurality of photoresist films after exposure; and discharging ink into the opening. The photosensitivities of the plurality of photoresist films differ from each other.

15 Claims, 13 Drawing Sheets

(56) References Cited

U.S. PATENT DOCUMENTS

| | | | |
|---|---|---|---|
| 2008/0241429 A1* | 10/2008 | Chen | G02F 1/133516 428/1.3 |
| 2011/0101317 A1 | 5/2011 | Gregory et al. | |
| 2013/0222936 A1 | 8/2013 | Kawanishi | |

FOREIGN PATENT DOCUMENTS

| | | |
|---|---|---|
| JP | 2011-526694 A | 10/2011 |
| WO | 2009/112569 A1 | 9/2009 |
| WO | 2012/060243 A1 | 5/2012 |

* cited by examiner

FIG. 38
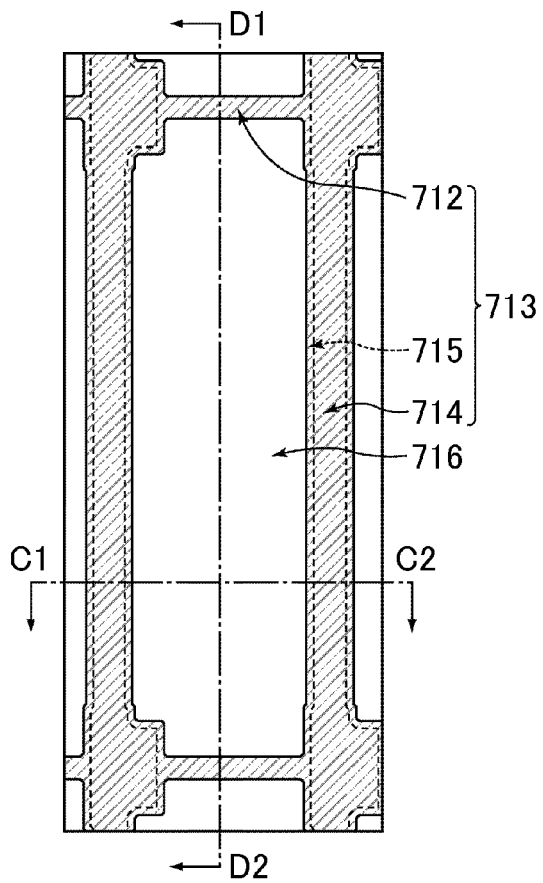
FIG. 39
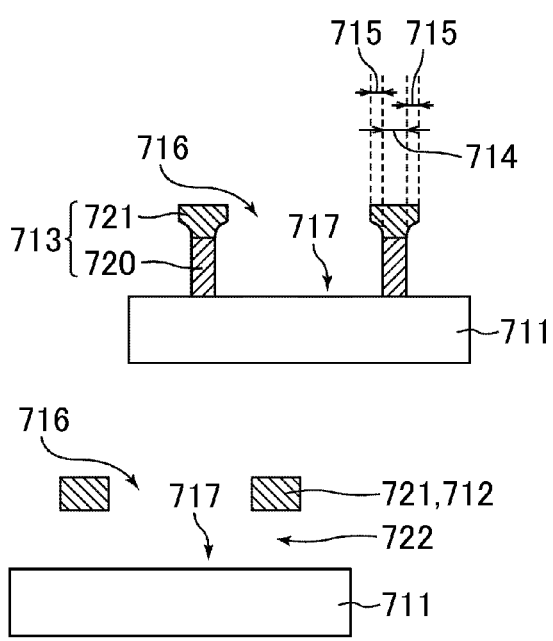
FIG. 40

COLOR FILTER SUBSTRATE AND METHOD FOR PRODUCING SAME

TECHNICAL FIELD

The present invention relates to a color filter substrate and a method of manufacturing the same. Specifically, the present invention relates to a color filter substrate suitable for forming a color filter thereon by an ink-jet method, and a method of manufacturing the same.

BACKGROUND ART

Color filter substrates are widely used in flat panel displays (FPD) such as liquid crystal displays. Color filter substrates generally include a transparent substrate, a black matrix (BM), and a color filter (CF). The BM and CF are formed on the transparent substrate.

Currently, the CF is mainly formed using photolithography. However, research on techniques in which the CF is formed using an ink-jet method has continued to make progress (see Patent Document 1, for example). With ink-jet methods, it is possible to reduce investment in equipment and cut material costs, and thus to reduce the cost of the color filter substrate. Moreover, the ink-jet method can easily be applied to the large color filter substrates.

Techniques for controlling the form and liquid repellency of the BM used in the ink-jet method have also been disclosed (see Patent Documents 2 and 3, for example). In these techniques, photolithography is used to form the BM, and several exposure steps are required for forming the BM.

Further, a method of producing a color filter substrate has been disclosed, the method including: forming a photoresist film; exposing the photoresist film via a photomask; forming partition walls having openings by developing the exposed photoresist film; and discharging ink into the openings. According to this method, the photomask includes a transmissive region, a light-shielding region and a light-modulating region. A transmittance of the light-modulating region is lower than a transmittance of the transmissive region and higher than a transmittance of the light-shielding region. The light-modulating region is provided between the transmissive region and the light-shielding region, extending along outlines of the transmissive region and the light-shielding region (see Patent Document 4, for example).

RELATED ART DOCUMENTS

Patent Documents

Patent Document 1: Japanese Patent Application Laid-Open Publication No. 2009-69726
Patent Document 2: Japanese Patent Application Laid-Open Publication No. 2009-145650
Patent Document 3: Japanese Patent Application Laid-Open Publication No. 2009-145910
Patent Document 4: WO Publication 2012-060243

SUMMARY OF THE INVENTION

Problems to be Solved by the Invention

In the following, the method of manufacturing the color filter substrate of Comparison Example 1 considered by the inventor is explained with reference to FIGS. 13 to 15. FIG. 13 is a cross-sectional view schematically showing a BM manufactured using a method of manufacturing a color filter substrate according to Comparison Example 1. FIG. 14 is a scanning-electron microscope (SEM) photograph of a cross-section of a BM manufactured using a method of manufacturing a color filter substrate according to Comparison Example 1. FIG. 15 is a view schematically showing a manufacturing process for the color filter substrate of Comparison Example 1, specifically illustrating a process of ink discharge.

First, as illustrated in FIG. 13, a BM 113 having an opening 116 is formed on a transparent substrate 111 using photolithography. As illustrated in FIG. 14, the BM 113 has a rectangular or trapezoidal cross-sectional profile. Next, plasma processing is performed in an atmosphere containing oxygen to make an exposed portion 117 of a substrate 111 (region within the opening 116 that has been exposed) hydrophilic. Next, plasma processing using a fluorine-based gas such as $CF_4$ is performed to make the surface of the BM 113 water-repellent. Next, red, blue or green ink 118 is discharged into the opening 116 of the BM 113 using an ink-jet method. At this time, the BM 113 functions as partition walls for preventing the flow of the ink 118. As illustrated in FIG. 15, the ink 118 has a thick convex form at a central portion. Thereafter, a pre-bake process and a post-bake process are performed to form a CF 119.

FIG. 16 is a three-dimensional image of the CF 119 and the BM 113 captured by white light interferometry. FIG. 17 is a graph showing a film thickness distribution of a CF 119. As illustrated in FIGS. 16 and 17, in the Comparison Example 1, each CF 119 had a convex profile in the same way as the ink 118, and the profiles of film thickness (film form) of the CFs 119 were non-uniform. Hence, when the liquid crystal panel was assembled with the color filter substrate manufactured by the above-described method, the thickness of the liquid crystal layer was non-uniform within sub-pixels. As a result, optical characteristics, specifically the display characteristics, of the liquid crystal display including the liquid crystal panel were poor in comparison to when the CF was formed using photolithography.

Thus, when the ink-jet method was used, it was particularly likely that CFs of non-uniform film thickness would be formed.

The present invention was conceived after looking at the above-described phenomenon with the aim of providing a color filter substrate capable of improving the uniformity in the film thickness of the color filter, and a method of manufacturing the same.

Means for Solving the Problem

The inventor performed wide-ranging research on methods of manufacturing a color filter substrate capable of improving uniformity in film thickness of the color filter, paying particular attention to the partition walls that prevent ink flow. The inventor discovered that, by forming a plurality of photoresist films with mutually differing photosensitivity in layers on a transparent substrate and exposing the plurality of photoresist films via a photomask, it was possible to remove film nearest the transparent substrate from within the plurality of photoresist films to form a lip portion on the partition walls. Realizing that this could neatly solve the above-described problem, the inventor arrived at the present invention.

Specifically, a first aspect of the present invention is a method of manufacturing a color filter substrate, the method including:

(a) layering a plurality of photoresist films on a transparent substrate;

(b) exposing the plurality of photoresist films via a photomask;

(c) forming partition walls having an opening defined therebetween by developing the plurality of photoresist films after exposure; and (d) discharging ink into the openings, wherein photosensitivities of the plurality of photoresist films differ from one another.

While the method of manufacturing the color filter substrate must include processes of the type described, it is not limited by processes other than these. Preferable embodiments of the method of manufacturing the color filter substrate are explained in detail below. Note also that the below-described embodiments may be appropriately combined.

Each of the plurality of photoresist films may be of a negative type, and the photosensitivities of the plurality of photoresist films may become smaller with proximity to the transparent substrate. Accordingly, a lip portion of the partition wall can be easily formed.

Each of the plurality of photoresist films may be of a positive type, and the photosensitivities of the plurality of photoresist films may become smaller with proximity to the transparent substrate. Accordingly, a lip portion of the partition wall can be easily formed.

The photomask may include a transmissive region, a light-shielding region, and a light-modulating region, a transmittance of the light-modulating region may be lower than a transmittance of the transmissive region and higher than a transmittance of the light-shielding region, and the light-modulating region may be provided along an outline, in a plan view, of each of the light-shielding region and between the transmissive region and the light-shielding region. Accordingly, a form of the lip portion of the partition wall can be easily optimized.

Note that the transmissive region does not need to fully transmit light of all wavelengths. It is preferable that the transmittance of the transmissive region at wavelengths of 350 to 450 nm be 90 to 95%.

Also, the light-shielding region does not need to fully block light of all wavelengths. It is preferable that the transmittance of the light-shielding region at wavelengths of 350 to 450 nm be 1% or less.

It is preferable that the transmittance of the light-modulating region at wavelengths of 350 to 450 nm be 2 to 80%.

The opening may be a first opening, in the step (c), a second opening may be defined in addition to the first opening by the partition walls, in the step (d), besides the first ink being discharged, second ink of a different color from that of the first ink may be discharged into the second opening, and the light-modulating region may be provided on the photomask at a location that corresponds to a first boundary between the first opening and the partition wall, and need not be provided at a location that corresponds to a second boundary between the second opening and the partition wall associated thereto.

Accordingly, color filters of a plurality of colors having different film thicknesses to one another can easily be formed, and the forms of the color filters can be easily optimized.

The photomask may include a plurality of the light-modulating regions, and transmittances of the plurality of light-modulating regions may differ from one another.

Accordingly, color filters of a plurality of colors having different film thicknesses to one another can easily be formed, and the forms of the color filters can be easily optimized.

Here, the differences in the transmittances of the plurality of light-modulating regions at wavelengths of 350 to 450 nm may be 1% or more.

The photomask may include a plurality of the light-modulating regions, and transmittances of the plurality of light-modulating regions may be substantially the same.

Accordingly, color filters of a plurality of colors having substantially the same film thickness can easily be formed, and the form of the color filters can be easily optimized.

Here, the differences in the transmittances of the plurality of light-modulating regions at wavelengths of 350 to 450 nm may be less than 1%.

It is preferable that the light-modulating region be one of a half-tone region and a grey tone region. Accordingly, a transmittance of the light-modulating region can be set lower than a transmittance of translucent region and higher than a transmittance of light-shielding region.

The partition walls may each include a plurality of layers, among the plurality of layers, at least one of the layers, except that which is closest to the transparent substrate, may include a projection that projects towards the opening, and in the step (d), the ink may be discharged until contacting a surface of the projection on a side facing the transparent substrate.

The partition walls may each include a plurality of layers, among the plurality of layers, a layer furthest from the transparent substrate may include a bridge portion with a cavity therebelow, and in the step (d), the ink may be discharged until contacting a surface of the bridge portion on a side facing the transparent substrate.

Accordingly, it is possible to effectively suppress the sub-pixel variation in the film thickness (form) of color filters of the same color.

Another aspect of the present invention is a color filter substrate including:

a transparent substrate;

partition walls having an opening defined therebetween on the transparent substrate; and a color filter formed in the opening on the transparent substrate, wherein the color filter and the partition walls are formed on the transparent substrate, wherein the partition walls each includes a plurality of layers, wherein each of the plurality of layers includes a cured photoresist material, wherein, among the plurality of layers, at least one of the layers, except that which is closest to the transparent substrate, includes a projection that projects towards the opening, wherein the color filter has a shape that projects upwardly away from the transparent substrate and contacts a surface of the projection on a side facing the transparent substrate, and wherein photosensitivities of the photoresist material included in each of the plurality of layers differ from one another.

The color filter substrate can be manufactured using the method of manufacturing the color filter substrate. Hence, uniformity of film thickness in the color filters can be improved.

While the configuration of the color filter substrate must include elements of the type described, it is not limited by elements other than these. Preferable embodiments of the color filter substrate are explained in detail below. Note also that the below-described embodiments may be appropriately combined.

It is preferable that the partition walls do not include a liquid repellent. Accordingly, surface treatment of the partition wall can be implemented after the process to form the partition walls. Thus, the properties of the surface of the partition walls can be set to any properties (liquid affinity or repellency).

The opening, the color filter, and the projection may be a first opening, a first color filter, and a first projection, respectively, a second opening may be further defined between the partition walls, the color filter substrate may further include a second color filter formed in the second opening and on the transparent substrate, the at least one of the layers that has the projection may further include a second projection that projects towards the second opening, a color of the second color filter may differ from a color of the first color filter, the second color filter may have a shape that projects upwardly away from the transparent substrate and contacts a surface of the second projection on a side facing the transparent substrate, and a thickness of the second projection may differ from a thickness of the first projection.

Accordingly, color filters of a plurality colors having different film thicknesses to one another can easily be formed, and the forms of the color filters can be easily optimized.

Here, a difference in the thickness of the first projecting portion and the thickness of the second projecting portion may be 0.1 µm or more.

The opening, the color filter, and the projection may be a first opening, a first color filter, and a first projection, respectively, a second opening may be further defined between the partition walls, the color filter substrate may further include a second color filter formed in the second opening and on the transparent substrate, the at least one of the layers that has the projection may further include a second projection that projects towards the second opening, a color of the second color filter may differ from a color of the first color filter, the second color filter may have a shape that projects upwardly away from the transparent substrate and contacts a surface of the second projection on a side facing the transparent substrate, and a thickness of the second projection may be substantially the same as a thickness of the first projection.

Accordingly, color filters of a plurality of colors having substantially the same film thickness can easily be formed, and the form of the color filters can be easily optimized.

Here, a difference in the thickness of the first projecting portion and the thickness of the second projecting portion may 0.1 µm or less.

Among the plurality of layers, a layer furthest from the transparent substrate may include a bridge portion with a cavity therebelow, and the color filter may be formed in the cavity and contact a surface of the bridge portion on a side facing the transparent substrate.

Accordingly, it is possible to effectively suppress the subpixel variation in the film thickness (form) of color filters of the same color.

Effects of the Invention

According to the present invention, it is possible to realize a color filter substrate capable of improving uniformity of film thickness in a color filter substrate, and a method of manufacturing the same.

BRIEF DESCRIPTION OF THE DRAWINGS

FIG. 38 is a schematic plan view of partition walls manufactured using the method of manufacturing the color filter substrate of Embodiment 7.

FIG. 39 is a schematic cross-sectional view along the line C1-C2 in FIG. 38.

FIG. 40 is a schematic cross-sectional view along the line D1-D2 in FIG. 38.

DETAILED DESCRIPTION OF EMBODIMENTS

In the following, the present invention is described in more detail by provision of embodiments and with reference to figures. It is to be noted, however, that the present invention is not limited to these embodiments.

Embodiment 1

A method of manufacturing a color filter substrate of Embodiment 1 is explained below with reference to FIGS. 1 to 12.

Figure 1:
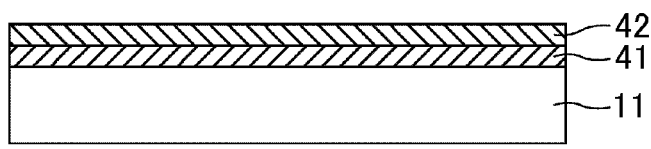
FIG. 1 is a view schematically showing a manufacturing process of a color filter substrate of Embodiment 1. Specifically, the figure shows the process for forming first and second photoresist films.

First, as illustrated in FIG. 1, a liquid or sheet-like first photoresist material is coated on or adhered to a transparent substrate 11, which is a glass substrate or the like. Then, a pre-bake process and main baking process are performed as required in the stated order to form a light-shielding first photoresist film 41. The film thickness of the first photoresist film 41 is 0.5 to 3.0 µm (preferably 1.0 to 2.0 µm).

Next, a liquid or sheet-like second photoresist material is coated on or adhered to the first photoresist film 41. Then, a pre-bake process and main baking process are performed as required in the stated order to form a light-shielding second photoresist film 42. The film thickness of the second photoresist film 42 is 0.5 to 3.0 µm (preferably 1.0 to 2.0 µm).

For both the first and second photoresist materials, a negative-type, regular photoresist material can be used. Note, however, that the photosensitivities of the first and second photoresist materials are different. More specifically, the photosensitivity of the first photoresist material with respect to later-described electromagnetic waves or an electron beam is higher than that of the second photoresist material.

To increase the photosensitivity of the first photoresist material, a concentration of photosensitive compounds (such as photo-radical initiators and radical polymerization compounds including double bonds) can be increased.

Note also that while there are no particular limits on the colors of the first and second photoresist materials or of the later-described partition wall, black is preferable. Thus, it is preferable that the first and second photoresist materials and later-described partition walls include a black pigment. With such an arrangement, excellent contrast can be realized.

Figure 2:
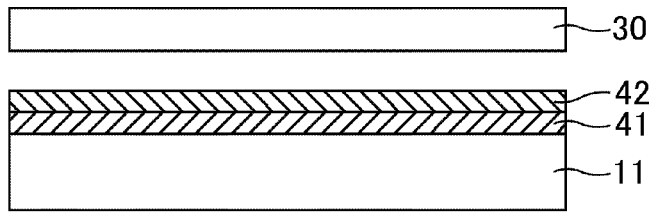
FIG. 2 is a view schematically showing a manufacturing process for the color filter substrate of Embodiment 1. Specifically, the figure shows the exposing process.

Next, as illustrated in FIG. 2, the photoresist films 41 and 42 are irradiated with electromagnetic waves (such as ultraviolet light) via the photomask 30. At this time, the luminous exposure is, for example, 20 to 500 mJ/cm$^2$ (preferably 100 to 300 mJ/cm$^2$).

In the present embodiment, there is no particular limit on the type of exposure equipment that can be used. Examples include stepper or mirror projection exposure equipment, proximity exposure equipment or the like.

Moreover, the irradiation may be performed with an electron beam instead of electromagnetic waves.

Figure 3:
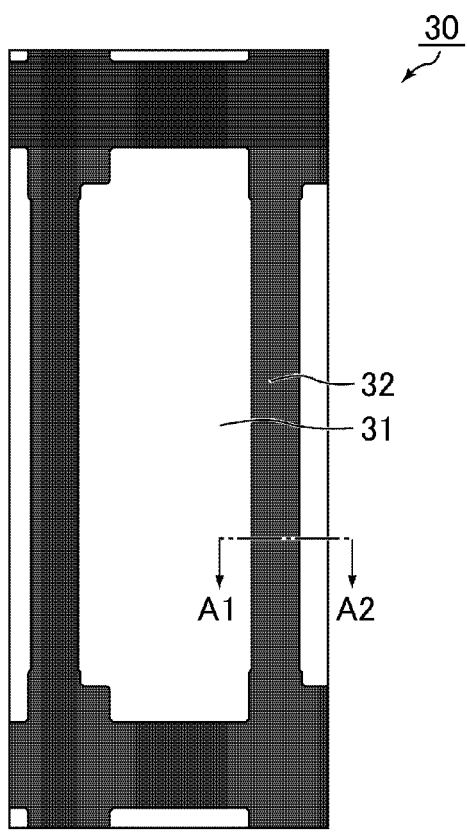
FIG. 3 is a schematic plan view of a photomask used in a manufacturing process of the color filter substrate of Embodiment 1.

As illustrated in FIG. 3, the photomask 30 includes a transmissive region 31 and a light-shielding region 32. The transmissive region 31 is provided in a rectangular form. The light-shielding region 32 is provided in a lattice form in regions other than the transmissive region 31.

Figure 4:
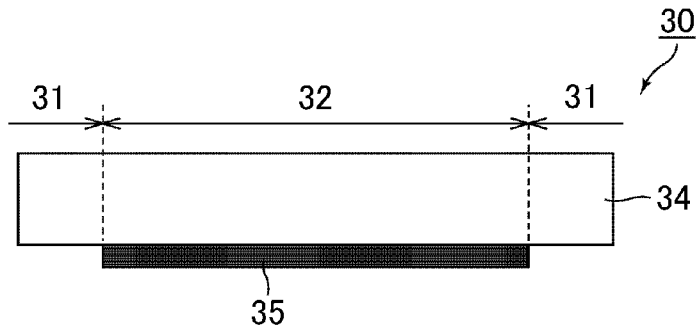
FIG. 4 is a schematic cross-sectional view along the line A1-A2 in FIG. 3.

As illustrated in FIG. 4, the photomask 30 includes a transparent substrate (supporting body) 34, and a patterned light-shielding layer 35 on the substrate 34.

The substrate 34 allows substantially all irradiating light to pass therethrough. Specifically, the transmittance of the substrate 34 at wavelengths of 350 to 450 nm is, for example, 90 to 95% and preferably 92%. For the material of the substrate 34, a glass such as soda lime glass, or synthetic silica glass may be used.

For the light-shielding layer 35, a light-shielding thin film is formed by patterning. The light-shielding layer 35 blocks substantially all irradiating light. Specifically, the transmittance of the shielding layer 35 at wavelengths of 350 to 450 nm is, for example, no higher than 1% and preferably substantially 0%. For the material of the light-shielding layer 35, a metal such as chromium may be used.

The light-shielding layer 35 is formed in the entire region of the light-shielding region 32 and not formed in the transmissive region 31. Thus, in the transmissive region 31, only the substrate 34 is present and substantially all incident light is allowed to pass therethrough. Further, the light-shielding region 32 blocks substantially all incident light.

The transmittances of the transmissive region 31 and the light-shielding region 32 are the same as the transmittances of the substrate 34 and the light-shielding layer 35 respectively.

Figure 5:
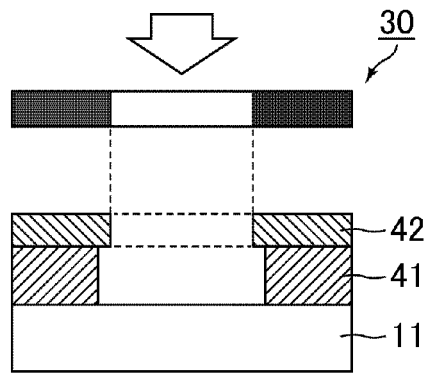
FIG. 5 is a schematic cross-sectional view of partition walls manufactured using the method of manufacturing the color filter substrate of Embodiment 1.

Next, the exposed photoresist films 41 and 42 are developed using a development liquid such as potassium hydroxide solution or the like, to form a photoresist pattern. Accordingly, the portions exposed via the transmissive region 31 of the photoresist films 41 and 42 are substantially all removed. By contrast the portions corresponding to the light-shielding region 32 of the photoresist films 41 and 42, which is to say the unexposed regions, nearly all remain. Note, however, that since the photosensitivity of the first photoresist film 41 is higher than the photosensitivity of the second photoresist film 42, the upper-layer second photoresist film 42 is removed over a narrower range and the lower-layer first photoresist film 41 is removed over a wider range. As a result, as illustrated in FIG. 5, later-described lip portions can be formed from the second photoresist film 42.

Next, the photoresist pattern is irradiated with electromagnetic waves (such as ultraviolet light) or electron beams.

Next, a baking process is performed at 160 to 300° C. (preferably 200 to 260° C.).

Figure 6:
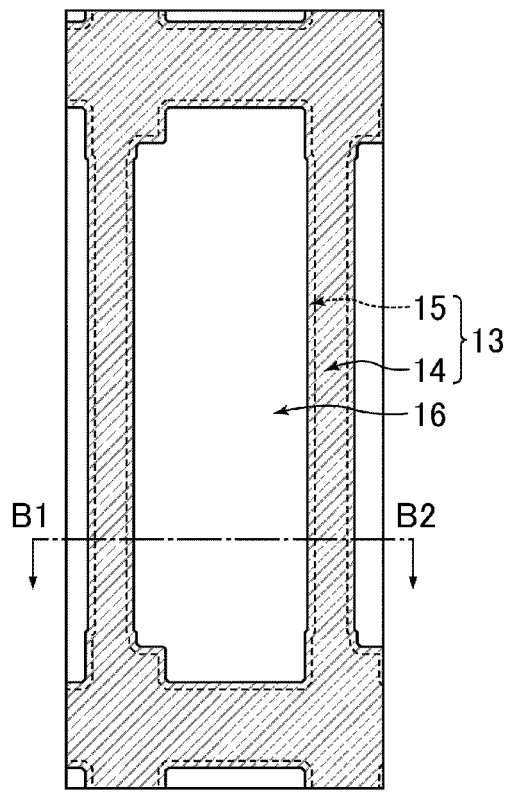
FIG. 6 is a schematic plan view of partition walls manufactured using the method of manufacturing the color filter substrate of Embodiment 1.
Figure 7:
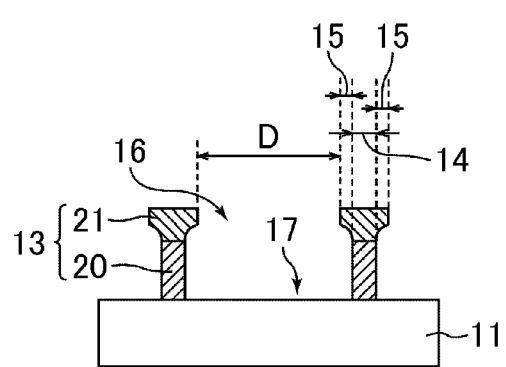
FIG. 7 is a schematic cross-sectional view along the line B1-B2 in FIG. 6.

With the above-described process, partition walls (banks) 13 are formed on the substrate 11, as illustrated in FIGS. 6 and 7.

In the partition walls 13, a plurality of rectangular openings 16 are formed. The partition walls 13 include a lattice-like body portion 14 and a lip portion (projecting portion) 15. The lip portion 15 projects from an upper part of the body portion 14 (portion at opposite end to the substrate 11) to the opening 16 side (towards the opening 16). The partition wall 13 includes a first layer portion 20 (portion on the substrate 11 side) and a second layer portion 21 (portion on opposite side to the substrate 11) layered on the first layer portion 20, and the lip portion 15 is included in the second layer portion 21. The lip portion 15 protrudes further to the opening 16 side than the first layer portion 20. A thickness of the lip portion 15, specifically the thickness of the portion abutting the body portion 14 of the lip portion 15, is approximately 0.2 to 0.5 μm. A width of the lip portion 15 is approximately 3 to 30 μm.

Figure 13:
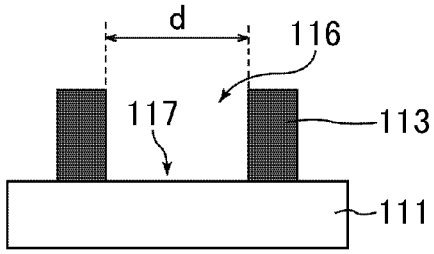
FIG. 13 is a schematic cross-sectional view of a manufactured BM using a method of manufacturing a color filter substrate of Comparison Example 1.
Figure 14:
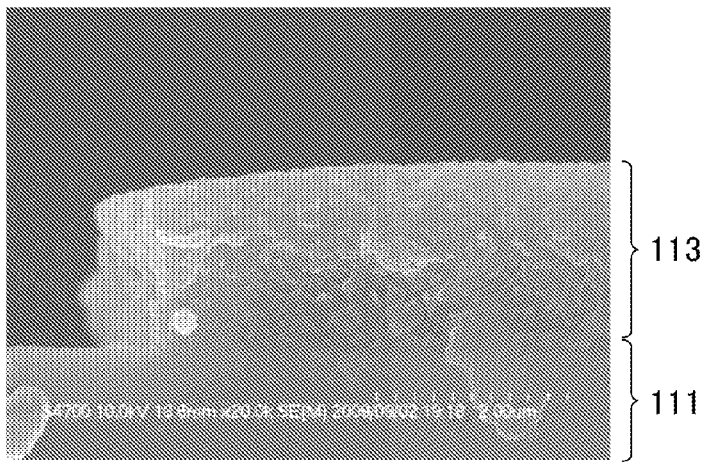
FIG. 14 is an SEM photograph of a cross-section of the BM manufactured using the method of manufacturing the color filter substrate of Comparison Example 1.
Figure 15:
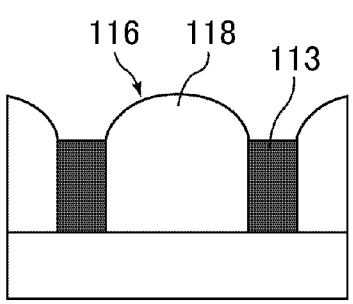
FIG. 15 is a view schematically showing a manufacturing process for the color filter substrate of Comparison Example 1. Specifically, the figure shows the process of ink discharge.
Figure 16:
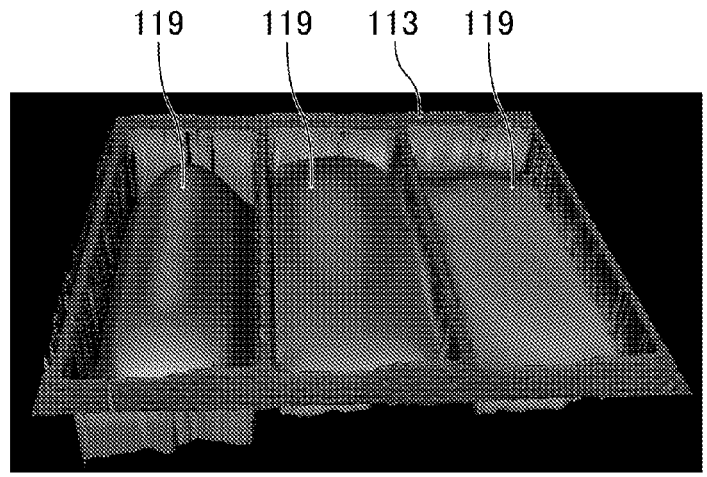
FIG. 16 is a three-dimensional image captured by white light interferometry of a CF and BM manufactured using the method of manufacturing the color filter substrate of Comparison Example 1.
Figure 17:
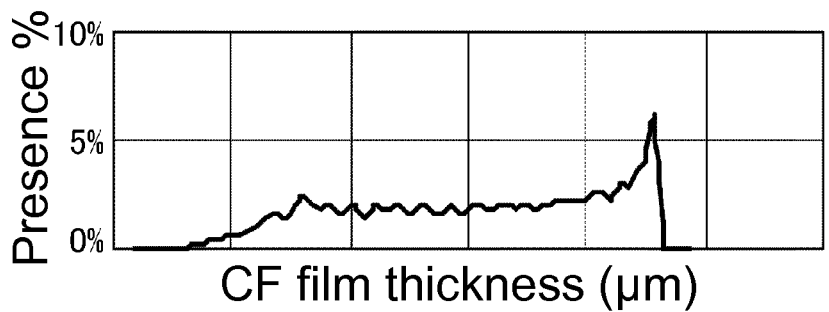
FIG. 17 is a graph showing a film thickness distribution of the CF manufactured using the method of manufacturing the color filter substrate of Comparison Example 1.

As illustrated in FIGS. 7 and 13, a distance D between opposing lip portions 15 is approximately equal to a distance d between opposing portions of the BM 113 of Comparison Example 1.

Next, plasma processing is performed in an atmosphere containing oxygen. As a result, an exposed portion 17 of the substrate 11 (region within the opening 16 that has been exposed) is rendered lyophilic (preferably hydrophilic).

Next, plasma processing using a fluorine-based gas such as $CF_4$ is performed. As a result, the surface of the partition walls 13 is rendered liquid-repellent (preferably water-repellent). Note also that while a liquid repellent may be mixed with the first and second photoresist material instead of performing the plasma processing, it is preferable not to include a liquid repellent in the first or second photoresist material, or the partition walls 13.

Figure 8:
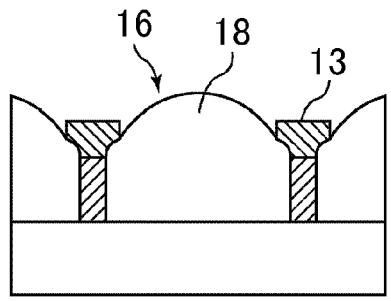
FIG. 8 is a view schematically showing a manufacturing process of the color filter substrate of Embodiment 1. Specifically the figure shows a process of ink discharge.

Next, red, blue and green ink 18 is discharged into the openings 16, which is to say onto the exposed portion 17, using ink-jet equipment. As illustrated in FIG. 8, the ink 18 spreads out within the openings 16 until being arrested by the partition walls 13. As a result, the insides of the openings 16 are filled with the ink 18. Thus, the partition walls 13 function to prevent the flow of the ink 18 and function as the black matrix. Further, the ink 18 has a projecting form (convex form) on the opposite side to the substrate 11 due to the effects of surface tension. The apex of the ink 18 is significantly higher than the partition walls 13, with a height from the surface of the substrate 11 to the apex of the ink 18 being approximately 10 to 15 μm, which is 5 to 20 times the height of the partition walls 13.

Figure 9:
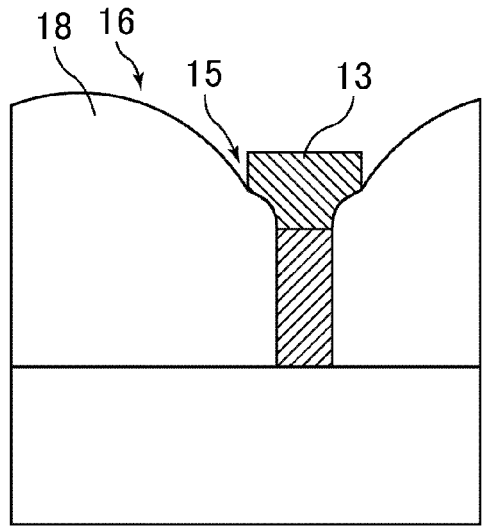
FIG. 9 is a schematic cross-sectional view of the lip portion of the partition wall in FIG. 8 and a region in proximity to the same.

As illustrated in FIG. 9, the ink 18 contacts bottom surfaces of the lip portions 15 (the surface on the substrate 11 side, which is the surface opposing the substrate 11). Hence, the surface of the ink 18 is pressed towards substrate 11 by the lip portions 15. In other words, pressure toward the substrate 11 side is applied to the ink 18. As a result, the surface of the ink 18 is flatter than in the case of the Comparison Example 1. Also, the different colored inks 18 can be prevented from surmounting the partition walls 13 and mixing. Moreover, since the ink 18 does not spread to the partition walls 13, it is possible to prevent gaps being created between later-described color filters (CF) 19 and the partition walls 13.

Figure 10:
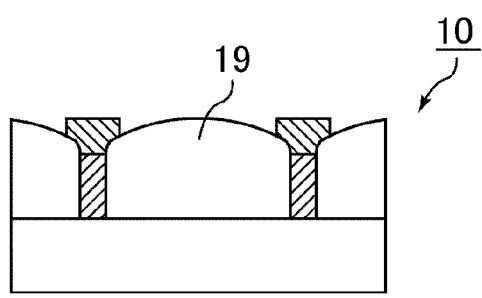
FIG. 10 is a schematic cross-sectional view of the color filter substrate manufactured using the method of manufacturing the color filter substrate of Embodiment 1.

Next, a pre-bake process and main baking process are performed in the stated order. As a result, the solvent in the inks 18 evaporates, and the red, green and blue CFs 19 are formed, as illustrated in FIG. 10. The CFs 19 are partitioned by the partition walls 13. This completes the color filter substrate 10.

The CFs 19 of each color have a form that projects away from the substrate 11 (convex form). Further, although CFs 19 of each color are thinner by an amount corresponding to the amount of solvent that evaporated from the ink 18, each CF is in contact with the bottom surface of the lip portion 15.

Figure 11:
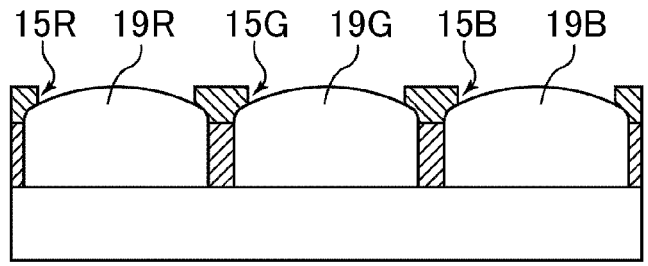
FIG. 11 is another schematic cross-sectional view of the color filter substrate manufactured using the method of manufacturing the color filter substrate of Embodiment 1.

As illustrated in FIG. 11, the film thicknesses of the CFs 19 of each color (red CF 19R, green CFs 19G and blue CF 19B) are approximately the same as each other. Further, the thicknesses of the lip portions for the CFs of each color (lip portion 15R, lip portion 15G, lip portion 15B) are approximately the same as each other, and, consequently, the form of the colored CFs can be easily optimized.

Figure 12:
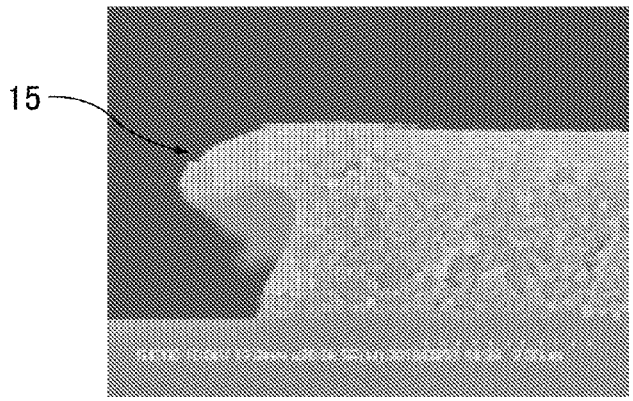
FIG. 12 is a scanning electron microscope (SEM) photograph (reference photograph) of a cross-section of partition walls manufactured using a method of manufacturing a color filter substrate different to the method of Embodiment 1.

FIG. 12 is SEM photograph (reference photograph) of a cross-section of partition walls manufactured using a method of manufacturing a color filter substrate different to the present embodiment. According to the present embodiment too, the lip portions 15 can be formed at the edge of the partition wall 13 in a similar manner to the partition wall shown in FIG. 12. Hence, as described above, the flatness of the surface of the ink 18 can be improved. As a result, flatness of the surface of the CFs 19 can be improved and uniformity of film thickness of the CFs 19 can be improved.

The CFs 19 have a color performance (optical characteristics) equivalent to the CFs formed using photolithography. Hence, when the color filter substrate 10 is used in a liquid crystal display, the liquid crystal display can realize optical characteristics (display characteristics) equivalent to the case when a color filter substrate with CFs formed using photolithography.

Moreover, in the present embodiment, only 1 exposure is required to form the partition walls 13, as opposed to 2 exposures in the technologies described in the Patent Documents 2 and 3. Thus, according to the present embodiment, the number of processes can be reduced in comparison to the technologies described in Patent Documents 2 and 3, and costs can therefore be reduced.

In the present embodiment, a surface treatment process of the partition walls 13 is performed after the process to form the partition walls 13. Hence, the properties of the surface of the partition walls 13 can be set to any properties (liquid affinity or repellency). By contrast, in the technology in Patent Documents 2 and 3, a BM-use resin containing a liquid repellent (ink repellent) is used. Due to the differences in the manufacturing processes, the technology of Patent Documents 2 and 3 does not permit the surfaces of the CFs 19 to be flattened in the manner of the present embodiment.

The number of layered photoresist films is not limited to being 2, and may be 3 or more. The following describes Embodiment 2 in which 3 layers of photoresist film are used.

Embodiment 2

The present embodiment is substantially the same as Embodiment 1 except for the following.

Figure 18:
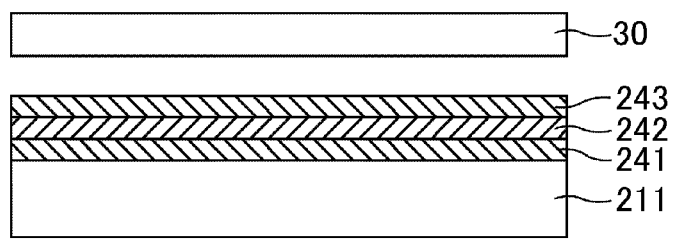
FIG. 18 is a view schematically showing a manufacturing process of a color filter substrate of Embodiment 2. Specifically, the figure shows the process for forming first, second and third photoresist films and an exposing process.

First, as illustrated in FIG. 18, a light-shielding first photoresist film 241 is formed on a transparent substrate 211, which is a glass substrate or the like, using a liquid or sheet-like first photoresist material. The film thickness of the first photoresist film 241 is 0.5 to 3.0 μm (preferably 1.0 to 2.0 μm).

Next, a light-shielding second photoresist film 242 is formed on the first photoresist film 241 using a liquid or sheet-like second photoresist material. The film thickness of the second photoresist film 242 is 0.5 to 3.0 μm (preferably 1.0 to 2.0 μm).

Next, a light-shielding third photoresist film 243 is formed on the second photoresist film 242 using a liquid or sheet-like third photoresist material. The film thickness of the third photoresist film 243 is 0.5 to 3.0 μm (preferably 1.0 to 2.0 μm).

For the first, second and third photoresist materials, a negative-type, regular photoresist material can be used. Note, however, that the photosensitivities of the first, second and third photoresist materials are different from one another. More specifically, photosensitivity with respect to later-described electromagnetic waves or an electron beam is higher for the second photoresist material than for the third photoresist material, and higher for the first photoresist material than for the second photoresist material.

Note also that while there are no particular limits on the colors of the first, second and third photoresist materials or of the later-described partition wall, black is preferable. Thus, it is preferable that the first, second and third photoresist materials and later-described partition walls include a black pigment.

Next, the photoresist films 241, 242 and 243 are irradiated with electromagnetic waves (such as ultra-violet light) via the above-described photomask 30. The photomask 30 includes a transmissive region 31 and a light-shielding region 32, as described above. At this time, the luminous exposure is, for example, 50 to 300 mJ/cm$^2$ (preferably 100 to 200 mJ/cm$^2$). Note that the irradiation may be performed with an electron beam instead of electromagnetic waves.

Figure 19:
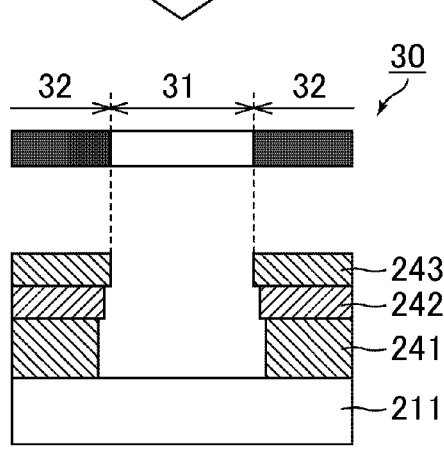
FIG. 19 is a schematic cross-sectional view of partition walls manufactured using the method of manufacturing the color filter substrate of Embodiment 2.

Next, the exposed photoresist films 241, 242 and 243 are developed using a development liquid such as potassium hydroxide solution or the like, to form a photoresist pattern. Accordingly, the portions exposed via the transmissive region 31 of the photoresist films 241, 242 and 243 are substantially all removed. By contrast the portions corresponding to the light-shielding region 32 of the photoresist films 241, 242 and 243, which is to say the unexposed regions, nearly all remain. Note, however, that the photosensitivity of the photoresist films 241, 242 and 243 increases as one moves closer to the substrate 211, and so the third photoresist film 243 forming the top layer is removed over the narrowest range, and first photoresist film 241 forming the bottom layer is removed over the widest range. As a result, as illustrated in FIG. 19, lip portions can be formed from the second and third photoresist films 242 and 243.

Next, the photoresist pattern is irradiated with electromagnetic waves (such as ultraviolet light) or electron beams.

Next, a baking process is performed at 160 to 300° C. (preferably 200 to 260° C.).

Figure 20:
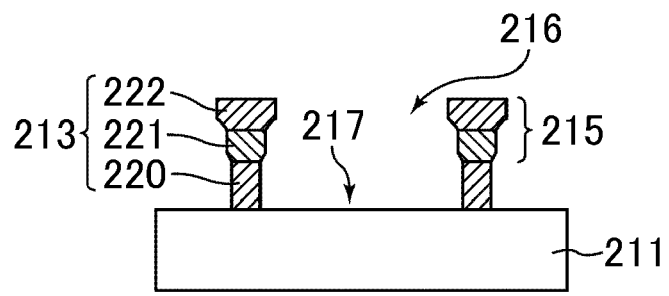
FIG. 20 is a schematic cross-sectional view of partition walls manufactured using the method of manufacturing the color filter substrate of Embodiment 2.

With the above-described process, partition walls (banks) 213 are formed on the substrate 211, as illustrated in FIG. 20.

The partition wall 213 includes a first layer portion 220, a second layer portion 221 layered on the first layer portion 220, and a third layer portion 222 layered on the second layer portion 221. The lip portion 215 is formed by the second and third layer portions 221 and 222. The lip portion 215 protrudes further toward an opening 216 of the partition wall 213 than first layer portion 220.

Next, plasma processing is performed in an atmosphere containing oxygen, in a similar manner to Embodiment 1.

Next, plasma processing using a fluorine-based gas such as $CF_4$ is performed, in a similar manner to Embodiment 1. It is preferable that the first, second and third photoresist materials and the partition walls 213 do not contain a liquid repellent.

Figure 21:
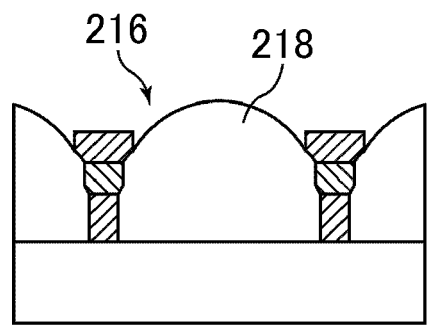
FIG. 21 is a view schematically showing a manufacturing process for the color filter substrate of Embodiment 2. Specifically the figure shows a process of ink discharge.

Next, as illustrated in FIG. 21, red, blue and green ink 218 is discharged into the openings 216, which are the exposed portions 217 of the substrate 211 (i.e. the exposed portions inside the holes 216), using ink-jet equipment, in a similar manner to Embodiment 1.

At this time, the ink 218 contacts the bottom surface of the lip portion 215 (the surface on the substrate 211 side, which is also the surface facing the substrate 211). As a result, the surface of the ink 218 can be flattened in a similar manner to Embodiment 1. Also, the different colored inks 218 can be prevented from surmounting the partition walls 213 and mixing. Moreover, since the ink 218 does not spread to the partition walls 213, it is possible to prevent a gap being created between later-described color filters (CF) 219 and the partition walls 213.

Figure 22:
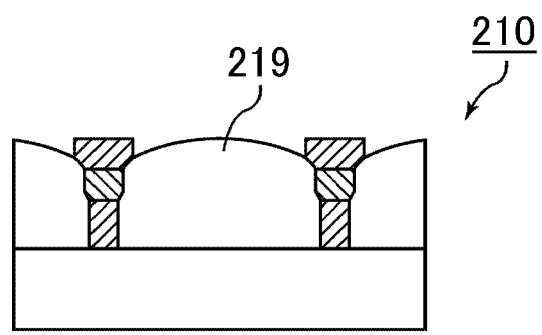
FIG. 22 is a schematic cross-sectional view of the color filter substrate manufactured using the method of manufacturing the color filter substrate of Embodiment 2.

Next, a pre-bake process and main baking process are performed in the stated order. As a result, the solvent in the inks 218 evaporates, and the red, green and blue CFs 219 are formed, as illustrated in FIG. 22. The CFs 219 are partitioned by the partition walls 213. This completes the color filter substrate 210.

The CFs 219 of each color have a form that projects away from the substrate 211 (convex form). Further, although the CFs 219 of each color are thinner by an amount corresponding to the amount of solvent that evaporated from the ink 218, each CF is in contact with the bottom surface of the lip portion 215.

According to the present embodiment, effects similar to Embodiment 1 can be achieved.

Embodiment 3

The present embodiment is substantially the same as Embodiment 1 except for the following.

Figure 23:
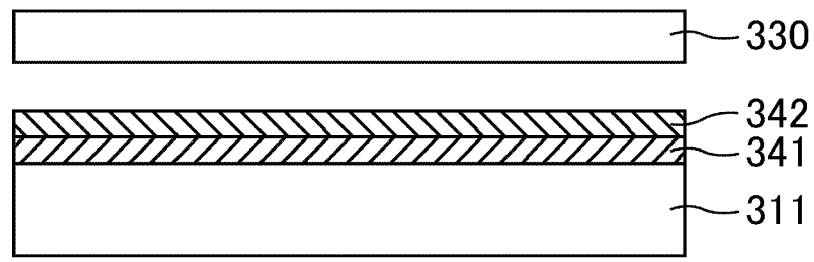
FIG. 23 is a view schematically showing a manufacturing process of a color filter substrate of Embodiment 3. Specifically, the figure shows the process for forming first and second photoresist films and an exposing process.

First, as illustrated in FIG. 23, a light-shielding first photoresist film 341 is formed on a transparent substrate 311, which is a glass substrate or the like, using a liquid or sheet-like first photoresist material.

Next, a light-shielding second photoresist film 342 is formed on the first photoresist film 341 using a liquid or sheet-like second photoresist material.

For both the first and second photoresist materials, a positive-type, regular photoresist material can be used. Note, however, that the photosensitivities of the first and second photoresist materials are different. More specifically, the photosensitivity of the first photoresist material with respect to later-described electromagnetic waves or an electron beam is lower than that of the second photoresist material.

Next, the photoresist films 341 and 342 are irradiated with electromagnetic waves (such as ultra-violet light) via the above-described photomask 330. At this time, the luminous exposure is, for example, 50 to 300 mJ/cm$^2$ (preferably 100 to 200 mJ/cm$^2$). Note that the irradiation may be performed with an electron beam instead of electromagnetic waves.

Figure 24:
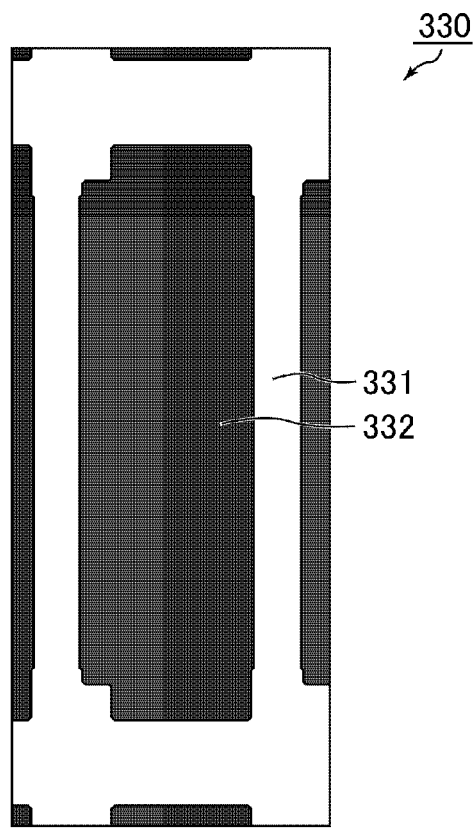
FIG. 24 is a schematic plan view of a photomask used in a manufacturing process of the color filter substrate of Embodiment 3.

As illustrated in FIG. 24, the photomask 330 includes a transmissive region 331 and a light-shielding region 332. The photomask 330 is substantially the same as the above-described photomask 30 except in that the patterns of the light-shielding layer differ. In the photomask 330 and the photomask 30, the patterns of the transmissive region and the light-shielding region are the inverse of each other. In other words, the pattern of the transmissive region of the photomask 330 is substantially the same as the pattern of the light-shielding region of the photomask 30, and the pattern of the light-shielding region of the photomask 330 is substantially the same as the pattern of the transmissive region of the photomask 30.

Figure 25:
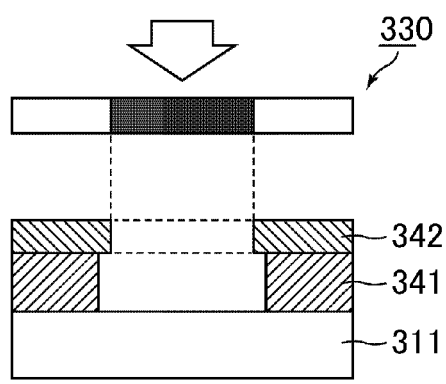
FIG. 25 is a schematic cross-sectional view of partition walls manufactured using the method of manufacturing the color filter substrate of Embodiment 3.

Next, the exposed photoresist films 341 and 342 are developed using a development liquid such as potassium hydroxide solution, to form a photoresist pattern. As a result, the portions corresponding to the light-shielding region 332 of the photoresist films 341 and 342, which is to say the unexposed region, are substantially all removed. By contrast, the portions exposed via the transmissive region 331 of the photoresist films 341 and 342 are almost all allowed to remain. Note, however, that since the photosensitivity of the first photoresist film 341 is lower than the photosensitivity of the second photoresist film 342, the upper-layer second photoresist film 342 is allowed to remain over a wider range and the lower-layer first photoresist film 341 is allowed to remain over a narrower range. As a result, as illustrated in FIG. 25, lip portions can be formed from the second photoresist film 342.

Thereafter, the color filter substrate of the present embodiment is completed by performing the same processes as in Embodiment 1.

According to the present embodiment, effects similar to Embodiment 1 can be achieved.

Embodiment 4

The present embodiment is substantially the same as Embodiment 1 except for the following. The main difference between the present embodiment and Embodiments 1 to 3 is that in Embodiments 1 to 3 a photomask with 2 levels of gradation is used, while in the present embodiment a multi-gradation photomask is used.

Figure 26:
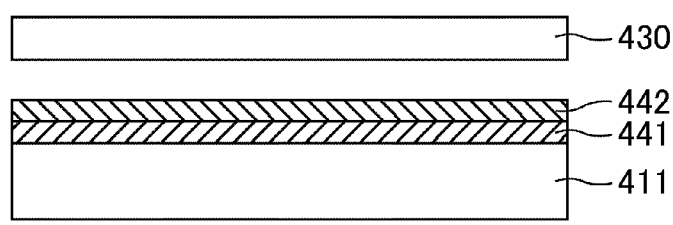
FIG. 26 is a view schematically showing a manufacturing process of a color filter substrate of Embodiment 4. Specifically, the figure shows the process for forming first and second photoresist films and an exposing process.

First, as illustrated in FIG. 26, a light-shielding first photoresist film 441 is formed on a transparent substrate 411, which is a glass substrate or the like, using a liquid or sheet-like first photoresist material.

Next, a light-shielding second photoresist film 442 is formed on the first photoresist film 441 using a liquid or sheet-like second photoresist material.

For both the first and second photoresist materials, a negative-type, regular photoresist material can be used. Note, however, that the photosensitivities of the first and second photoresist materials are different. More specifically, the photosensitivity of the first photoresist material with respect to later-described electromagnetic waves or an electron beam is higher than that of the second photoresist material.

Next, the photoresist films 441 and 442 are irradiated with electromagnetic waves (such as ultra-violet light) via the above-described photomask 430. At this time, the luminous exposure is, for example, 50 to 300 mJ/cm$^2$ (preferably 100 to 200 mJ/cm$^2$). Note that the irradiation may be performed with an electron beam instead of electromagnetic waves.

Figure 27:
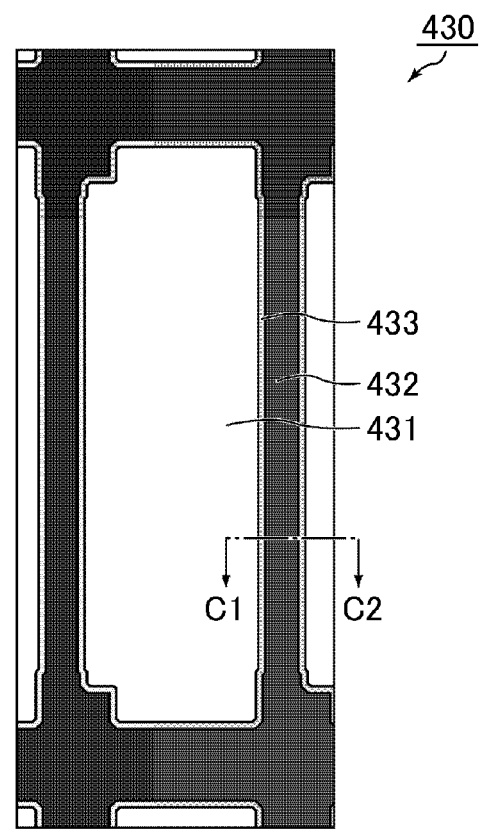
FIG. 27 is a schematic plan view of a photomask used in a manufacturing process of the color filter substrate of Embodiment 4.
Figure 28:
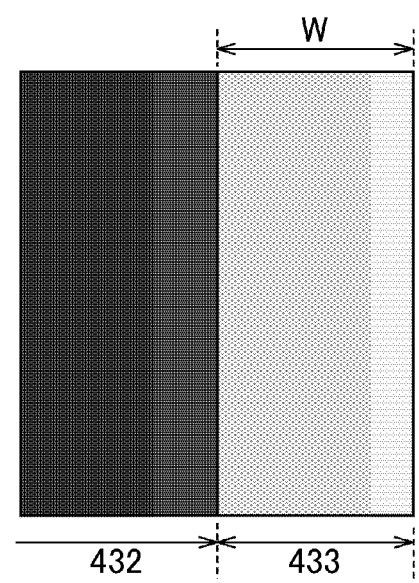
FIG. 28 is an enlarged view of the photomask shown in FIG. 27, showing a half-tone region and a light-shielding region.

As illustrated in FIGS. 27 and 28, the photomask 430 includes a transmissive region 431, a light-shielding region 432, and a half-tone region (HT region) 433 that is a light-modulating region.

The HT region 433 is provided between the transmissive region 431 and the light-shielding region 432, extending along the outline of each of the transmissive region 431 and the light-shielding region 432. The transmissive region 431 is provided in regions outside the light-shielding region 432 and the HT region 433, and has a rectangular form. The light-shielding region 432 is provided in a lattice form. Thus, the HT region 433 is provided along edges of the light-shielding region 432. Further, the HT region 433 borders one of the regions 431 and 432. The other of the regions 431 and 432 corresponds to all regions except the one of the regions 431 and 432 and the HT region 433.

A width W of the HT region 433 is 0.5 to 10 μm (preferably 1.0 to 3.0 μm).

Figure 29:
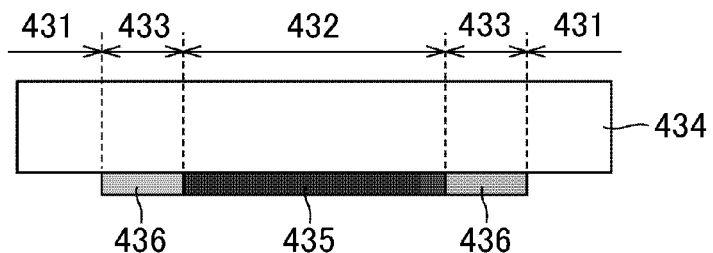
FIG. 29 is a schematic cross-sectional view along the line C1-C2 in FIG. 27.

As illustrated in FIG. 29, the photomask 430 includes a transparent substrate (supporting body) 434, a light-shielding layer 435 and a semi-transmissive layer 436. The light-shielding layer 435 and the semi-transmissive layer 436 have each been patterned on the substrate 434.

The substrate 434 is substantially the same as the substrate 34 described in Embodiment 1.

The light-shielding layer 435 is formed in a similar manner to the light-shielding layer 35 described in Embodiment 1 and has properties substantially the same as the light-shielding layer 35.

The semi-translucent layer 436 is formed by patterning a semi-transmissive thin film. The semi-transmissive layer 436 allows a portion of the irradiating light to pass therethrough. Specifically, the transmittance of the semi-transmissive layer 436 at wavelengths of 350 to 450 nm is, for example, from 20% (preferably 30%) to 80% (preferably 70%). For the material of the semi-transmissive layer 436, chromium, molybdenum silicide, or an oxide, nitride, carbide, oxynitride, carbonitride or the like containing the element tantalum, aluminum, silicon or the like may be used.

The semi-transmissive layer 436 is formed over an entire area of the HT region 433. Hence, the HT region 433 transmits a portion of the irradiating light therethrough.

The transmittances of the transmissive region 431, the light-shielding region 432 and the HT region 433 are substantially the same as the transmittances of the substrate 434, the light-shielding layer 435, and the semi-transmissive layer 436 respectively. Thus, when listed in ascending order of transmittance, the regions of the photomask 430 are the light-shielding region 432, the HT region 433 and the transmissive region 431.

Figure 30:
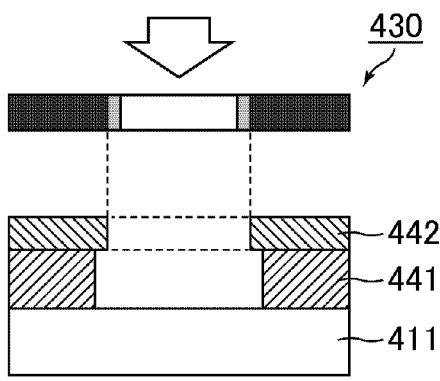
FIG. 30 is a schematic cross-sectional view of partition walls manufactured using the method of manufacturing the color filter substrate of Embodiment 4.

Next, the exposed photoresist films 441 and 442 are developed using a development liquid such as potassium hydroxide solution, to form a photoresist pattern. Accordingly, the portions exposed via the transmissive region 431 of the photoresist films 441 and 442 are substantially all removed. By contrast, the portions exposed via the HT region 433 of the photoresist films 441 and 442 are partially removed and the portions corresponding to the light-shielding region 432 of the photoresist films 441 and 442, which is to say the unexposed regions, nearly all remain. Note, however, that since the photosensitivity of the first photoresist film 441 is higher than the photosensitivity of the second photoresist film 442, the upper-layer second photoresist film 442 is removed over a narrower range and the lower-layer first photoresist film 441 is removed over a wider range. As a result, as illustrated in FIG. 30, lip portions can be formed from the second photoresist film 442.

Thereafter, the color filter substrate of the present embodiment is completed by performing the same processes as in Embodiment 1. In the present embodiment too, CFs of a plurality of colors with substantially the same film thickness can easily be formed in a similar manner to that shown in FIG. 11, and the forms of the CFs can be easily optimized.

Moreover, according to the present embodiment, effects similar to Embodiment 1 can be achieved.

Embodiment 5

The present embodiment is substantially the same as Embodiment 4 except for the following.

In the present embodiment, the exposing process is performed using a photomask 530 instead of the photomask 430.

Figure 31:
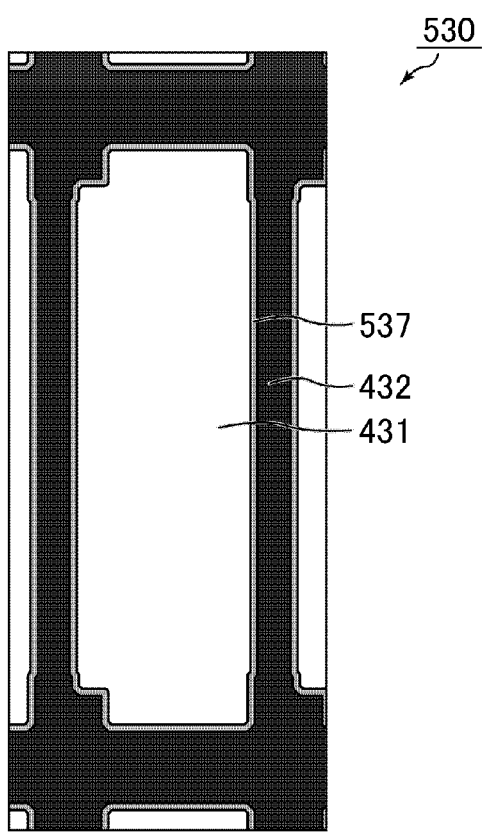
FIG. 31 is a schematic plan view of a photomask used in a manufacturing process for a color filter substrate of Embodiment 5.

As illustrated in FIG. 31, the photomask 530 is substantially the same as the above-described photomask 430 except in that the photomask 530 includes a grey tone (GT) region 537 as a light-modulating region in place of the HT region 433. The GT region 537 is formed from a light-shielding portion and a transmissive portion smaller than a resolution limit of the exposure equipment. The light-shielding portion includes a light-shielding layer similar to that of the light-shielding region 432. In other words, the light-shielding portion is formed using the above-described light-shielding thin film. The transmissive portion includes only the substrate 434 and does not include the light-shielding layer. Thus, the transmissive portion allows nearly all of the incident light to pass therethrough. On the other hand, the light-shielding portion includes the light-shielding layer, and so blocks substantially all incident light. Hence, the GT region 537 allows a portion of the incident light to pass therethrough.

The transmittance of the GT region 537 at wavelengths of 350 to 450 nm is substantially a few percent. Thus, when listed in ascending order of transmittance, the regions of the photomask 530 are the light-shielding region 532, the GT region 537, and the translucent region 531.

There are no particular limits on the pattern of the translucent portion in the GT region 537, and slits, dots, a fine pattern or the like may be used. The transmissive portion is smaller than a resolution limit of the exposure equipment, and can therefore form a lip portion without the transmissive portion pattern being transferred. According to the present embodiment too, effects similar to Embodiments 1 and 4 can be achieved.

Embodiment 6

The present embodiment is substantially the same as Embodiment 3 except for the following.

In the photomask used in the exposing process of the present embodiment, settings for the presence, type, transmittance, width and the like of the light-modulating region differ between CF colors. In other words, the light-modulating region of the photomask used in the present embodiment includes a plurality of regions that differ from one another in at least one of pattern type, transmittance and width. Further, light-modulating regions may be formed in correspondence with CF lip portions of a specific color. Thus, the form (thickness, for example) of the lip portions can be optimized for each CF color. The reason to optimize is that generally the optimal form of the lip portion will differ according to the ink color (type).

For instance, the photomask used in the present embodiment may include HT regions in correspondence with lip portions of CFs of a first color, which is to say in correspondence with first boundaries between first openings and the partition walls, and GT regions in correspondence with lip portions of CFs of a second color, which is to say in correspondence with first boundaries between second openings and the partition walls. On the other hand, the photomask may include not light-modulating regions but light-shielding regions in correspondence with lip portions of CFs of a third color, which is to say in correspondence with third boundaries between third openings and the partition walls. Thus, the transmittance can easily be varied through the use of HT regions, GT regions and light-shielding regions. Thus, the form of the lip portions can be optimized for each color more easily.

Figure 32:
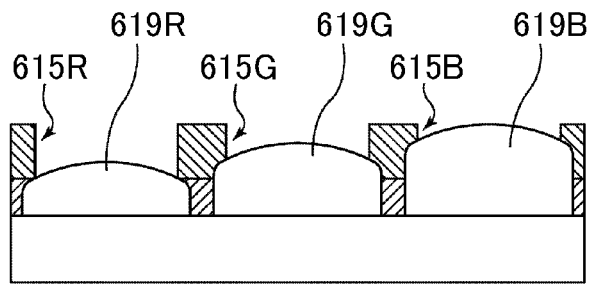
FIG. 32 is a schematic cross-sectional view of a color filter substrate manufactured using a method of manufacturing a color filter substrate of Embodiment 6.

Further, in the present embodiment, the film thicknesses (heights) of the CFs of each color differ from one another. More specifically, the average film thicknesses and maximum thicknesses (thickness at the apex portion) of the CFs of each color differ from one another. Moreover, the thicknesses of the lip portions for the CFs of each color also differ from one another. Specifically the thickness of the portion abutting the body portion of the lip portion is set to be approximately 0.2 to 0.5 μm. For example, as illustrated in FIG. 32, green CF 619G is thicker than red CF 619R and a blue CF 619B is thicker than the CF 619G. Similarly, the lip portion 615G for the green CF is thicker than the lip portion 615B for the blue CF, and the lip portion 615R for the red CF is thicker than the lip portion 615G. By forming the lip portions 615R, 615G and 615B, the form of the CFs of each color having the above-described film thicknesses can be easily optimized.

Embodiment 7

The present embodiment is substantially the same as Embodiment 1 except for the following.

Figure 33:
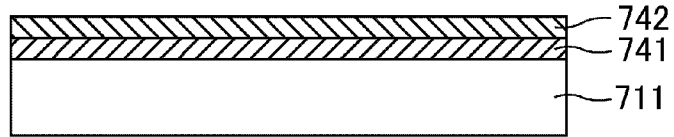
FIG. 33 is a view schematically showing a manufacturing process of a color filter substrate of Embodiment 7. Specifically, the figure shows the process for forming first and second photoresist films.

First, as illustrated in FIG. 33, a light-shielding first photoresist film 741 is formed on a transparent substrate 711, which is a glass substrate or the like, using a liquid or sheet-like first photoresist material.

Next, a light-shielding second photoresist film 742 is formed on the first photoresist film 741 using a liquid or sheet-like second photoresist material.

For both the first and second photoresist materials, a negative-type, regular photoresist material can be used. Note, however, that the photosensitivities of the first and second photoresist materials are different. More specifically, the photosensitivity of the first photoresist material with respect to later-described electromagnetic waves or an electron beam is higher than that of the second photoresist material.

Figure 34:
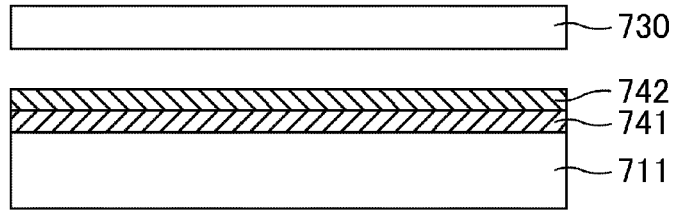
FIG. 34 is a view schematically showing a manufacturing process for the color filter substrate of Embodiment 7. Specifically, the figure shows the exposing process.

Next, as illustrated in FIG. 34, the photoresist films 741 and 742 are irradiated with electromagnetic waves (such as ultraviolet light) via a photomask 730. At this time, the luminous exposure is, for example, 50 to 300 mJ/cm$^2$ (preferably 100 to 200 mJ/cm$^2$). Note that the irradiation may be performed with an electron beam instead of electromagnetic waves.

Figure 35:
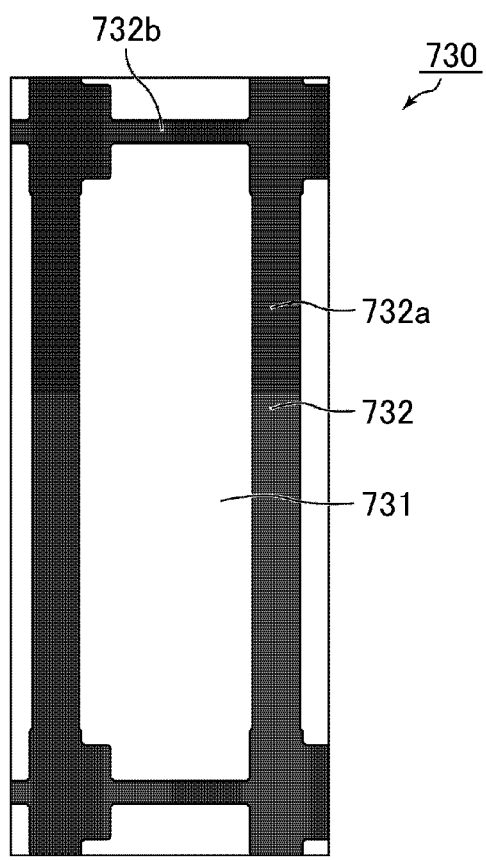
FIG. 35 is a schematic plan view of a photomask used in a manufacturing process for a color filter substrate of Embodiment 7.

As illustrated in FIG. 35, the photomask 730 includes a transmissive region 731 and a light-shielding region 732. The photomask 730 is substantially the same as the above-described photomask 30 except in that the patterns of the light-shielding layer differ slightly. The transmissive region 731 is provided in a rectangular form. The light-shielding region 732 is provided in a lattice form in regions other than the transmissive region 731. The light-shielding region 732 includes a relatively wide region 732a (region that extends vertically in FIG. 35) abutting a long side of the transmissive region 731 and a relatively narrow region 732b (region that extends horizontally in FIG. 35) abutting a short side of the transmissive region 731.

Figure 36:
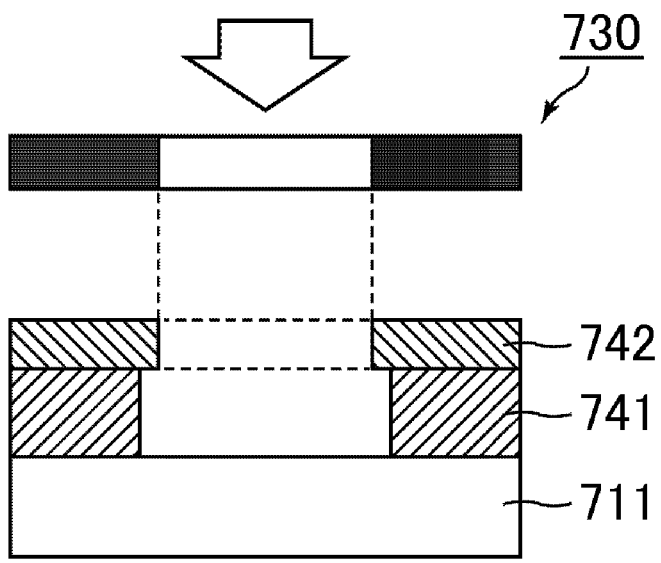
FIG. 36 is a schematic cross-sectional view of partition walls manufactured using the method of manufacturing the color filter substrate of Embodiment 7.
Figure 37:
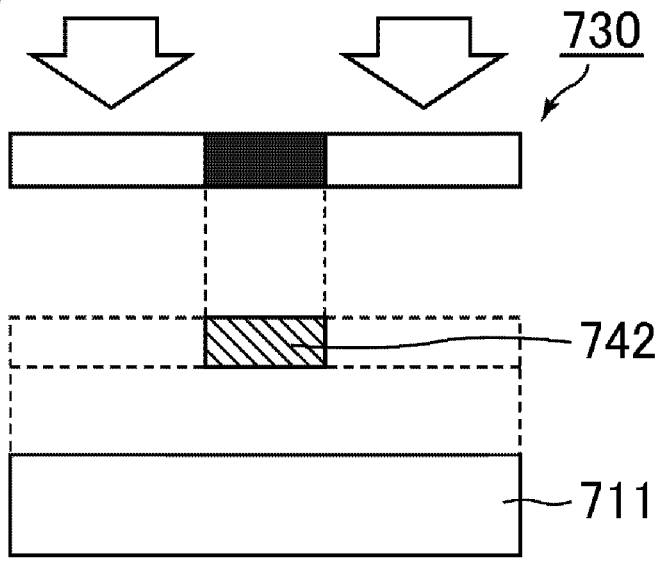
FIG. 37 is another schematic cross-sectional view of partition walls manufactured using the method of manufacturing the color filter substrate of Embodiment 7.

Next, the exposed photoresist films 741 and 742 are developed using a development liquid such as potassium hydroxide solution, to form a photoresist pattern. Accordingly, the portions exposed via the transmissive region 731 of the photoresist films 741 and 742 are substantially all removed. By contrast the unexposed portions corresponding to the region 732a of the photoresist films 741 and 742 nearly all remain. Note, however, that since the photosensitivity of the first photoresist film 741 is higher than the photosensitivity of the second photoresist film 742, the upper-layer second photoresist film 742 is removed over a narrower range and the lower-layer first photoresist film 741 is removed over a wider range. As a result, as illustrated in FIG. 36, lip portions can be formed from the second photoresist film 742. The portions corresponding to the region 732b of the photoresist film 742 nearly all remain. However, since the photosensitivity of the photoresist film 741 is high and the width of the region 732b is narrow, the portions corresponding to the region 732b of the photoresist film 741 are affected strongly by surrounding electromagnetic waves from the transmissive region 731. Thus, solubility of these portions increases overall and they are substantially all removed. As a result, as illustrated in FIG. 37, later-described bridging portions can be formed.

Next, the photoresist pattern is irradiated with electromagnetic waves (such as ultraviolet light) or electron beams.

Next, a baking process is performed at 160 to 300° C. (preferably 200 to 260° C.).

With the above-described process, partition walls (banks) 713 are formed on the substrate 711, as illustrated in FIGS. 38 to 40.

In the partition walls 713, a plurality of rectangular openings 716 are formed. The partition walls 713 include a stripe-like body portion 714, a lip portion (projecting portion) 715, and a bridging portion 712.

The lip portion 715 projects from an upper part of the body portion 714 (portion at opposite end to the substrate 711) to the opening 716 side (towards the opening 716). The partition wall 713 includes a first layer portion 720 (portion on the substrate 711 side) and a second layer portion 721 (portion on opposite side to the substrate 711) layered on the first layer portion 720, and the lip portion 715 is included in the second layer portion 721. The lip portion 715 protrudes further to the opening 716 side than first layer portion 720. A thickness of the lip portion 715, specifically the thickness of the portion abutting the body portion 714 of the lip portion 715, is approximately 0.2 to 0.5 µm. A width of the lip portion 715 is approximately 3 to 30 µm.

The bridging portion 712 is provided between the upper portions of mutually opposing body portions 714, forming a connection therebetween. The bridging portion 712 is included in the second layer portion 721. The first layer portion 720 is almost non-existent below the bridging portion 712 such that a cavity 722 is formed under the bridging portion 712. A thickness of the bridging portion 712 is approximately 0.2 to 0.5 µm. A width of the bridging portion 712 is approximately 3 to 30 µm.

Next, plasma processing is performed in an atmosphere containing oxygen. As a result, an exposed portion 717 of the substrate 711 (exposed region within the opening 716 and the cavity 722) is rendered lyophilic (preferably hydrophilic).

Next, plasma processing using a fluorine-based gas such as CF$_4$ is performed. As a result, the surface of the partition walls 713 is rendered liquid-repellent (preferably water-repellent). Note also that while a liquid repellent may be mixed with the first and second photoresist material instead of performing the plasma processing, it is preferable not to include a liquid repellent in the first or second photoresist material, or the partition walls 713.

Figure 41:
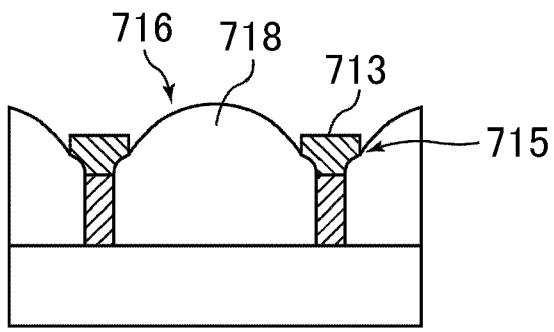
FIG. 41 is a view schematically showing a manufacturing process for the color filter substrate of Embodiment 7. Specifically the figure shows a process of ink discharge.
Figure 42:
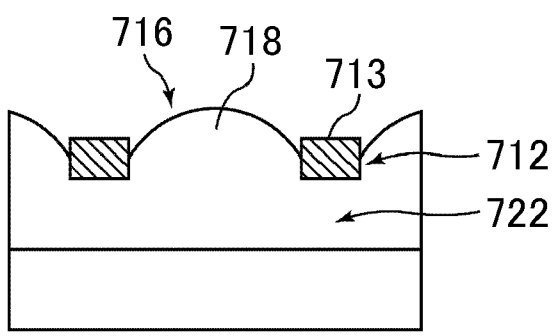
FIG. 42 is another view schematically showing a manufacturing process for the color filter substrate of Embodiment 7. Specifically the figure shows a process of ink discharge.

Next, red, blue and green ink 718 is discharged into the openings 716 using ink-jet equipment. Note however, that ink 718 of the same color is discharged into adjacent openings 716 (vertically aligned openings in FIG. 38) via the cavity 722. As illustrated in FIGS. 41 and 42, the ink 718 spreads out within the opening 716 and in the cavity 722 until being arrested by the partition walls 713. As a result, the insides of the opening 716 and the cavity 722 are filled with the ink 718. The ink 718 has a projecting form (convex form) on the opposite side to the substrate 711 due to the effects of surface tension. The apex of the ink 718 is significantly higher than the partition walls 713, with a height from the surface of the substrate 711 to the apex of the ink 718 being approximately 10 to 15 µm, which is 5 to 20 times the height of the partition walls 713.

The ink 718 contacts the bottom surfaces of the lip portion 715 and the bridging portion 712 (the surfaces on the substrate 711 side, which are also the surfaces facing the substrate 711). Hence, the surface of the ink 718 is pressed towards the substrate 711 by the lip portion 715 and the bridging portion 712. In other words, pressure toward the substrate 711 is applied to the ink 718. As a result, the surface of the ink 718 is flatter than in the case of Comparison Example 1. Also, the different colored inks 718 can be prevented from surmounting the partition walls 713 and mixing. Moreover, since the ink 718 does not spread to the partition walls 713, it is possible to prevent a gap being created between later-described color filters (CF) and the partition walls 713. Further, the inks 718 of each color can flow freely within the vertically aligned openings 716 linked by the cavity 722. Thus, it is possible to effectively suppress the sub-pixel variation in the film thickness (form) of CFs of the same color.

Figure 43:
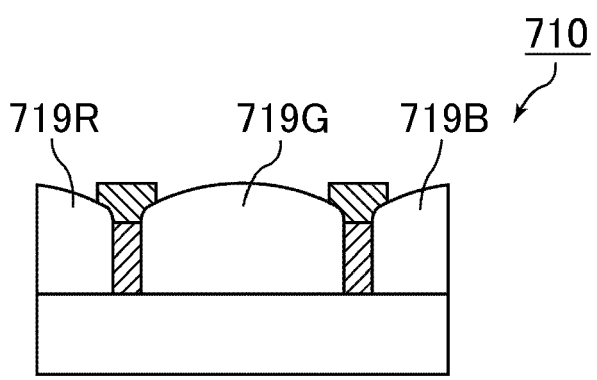
FIG. 43 is a schematic cross-sectional view of a color filter substrate manufactured using the method of manufacturing the color filter substrate of Embodiment 7.
Figure 44:
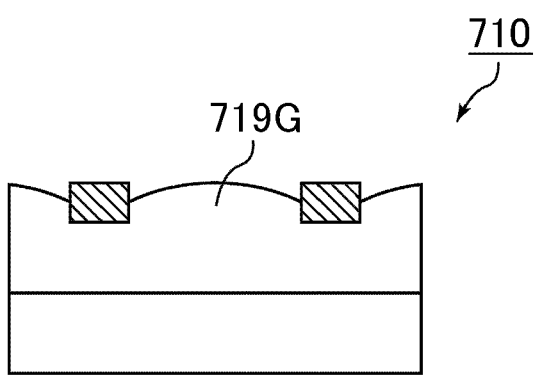
FIG. 44 is another schematic cross-sectional view of the color filter substrate manufactured using the method of manufacturing the color filter substrate of Embodiment 7.

Next, a pre-bake process and main baking process are performed in the stated order. As a result, the solvent in the inks 718 evaporates, and red CF 719R, green CF 719G and blue CF 719B are formed, as illustrated in FIGS. 43 and 44. The CFs are partitioned by the partition walls 713. Note, however, that the vertically adjacent CFs of the same color are linked to one another under the bridging portion 712. This completes the color filter substrate 710.

The CFs of each color have a form that projects away from the substrate 711 (convex form). Further, although the CFs of each color are thinner by an amount corresponding to the amount of solvent that evaporated from the inks 718, each CF is in contact with the bottom surface of the lip portion 715 and the bridging portion 712.

According to the present embodiment, the lip portion 715 and bridging portion 712 can be formed at the partition walls 713. Hence, effects similar to Embodiment 1 can be achieved. It is also possible to effectively suppress the sub-pixel variation in the film thickness (form) of CFs of the same color.

In the present embodiment, the number of layered photoresist films is not limited to being 2, and may be 3 or more.

Note also that there are no particular limits on the application of the color filter substrates of the present embodiments. Example applications include FPDs such as liquid crystal displays and organic EL displays.

Further, the photoresist material and partition walls may be transparent. However, in such a case, it is preferable that a separate light-shielding film is provided. The light-shielding film can be formed by patterning a thin film with light-shielding properties (for example, a metal film made of Chromium or the like). The transparent partition walls should be formed after forming the light-shielding film.

Also, there is no particular limit on the color and number of CF in the embodiments, and these can be set as appropriate. For instance, the CFs may include the 4 colors of red, blue, green and yellow, the 4 colors of red, blue, green and colorless, or the 5 colors of red, blue, green, yellow and cyan. Alternatively, the 3 colors of yellow, cyan, and magenta may be used.

Moreover, the above-described embodiments, may be appropriately combined without departing from the spirit of the present invention. For example, a positive-type plurality of photoresist film may be formed in layers and exposed via a photomask having a light-modulating region.

DESCRIPTION OF REFERENCE CHARACTERS 10, 710 color filter substrate
11, 211, 311, 411, 711 transparent substrate
13, 213, 713 partition wall
14, 714 body portion
15, 15R, 15G, 15B, 215, 615R, 615G, 615B, 715 lip portion (projecting portion)
16, 216, 716 opening
17, 217, 717 exposed portion
18, 218, 718 ink
19, 219 color filter (CF)
19R, 619R, CF 719R red color filter (CF)
19G, 619G, CF 719G green color filter (CF)
19B, 619B, CF 719B blue color filter (CF)
20, 220, 720 first layer portion
21, 221, 721 second layer portion
30, 330, 430, 530, 730 photomask
31, 331, 431, 731 transmissive region
32, 332, 432, 732, 732a, 732b light-shielding region
34, 434 substrate (supporting body)
35, 435 light-shielding layer
41, 42, 241, 242, 243, 341, 342, 441, 442, 741, 742 photoresist film
222 third layer portion
433 half-tone region (HT region)
436 semi-transmissive layer
537 grey-tone (GT) region
712 bridging portion
722 cavity

What is claimed is:

1. A method of manufacturing a color filter substrate, said method comprising:
    (a) layering a plurality of photoresist films on a transparent substrate;
    (b) exposing said plurality of photoresist films via a photomask;
    (c) forming partition walls having an opening defined therebetween by developing said plurality of photoresist films after exposure; and
    (d) discharging ink into said openings,
    wherein photosensitivities of the plurality of photoresist films differ from one another.

2. The method of manufacturing a color filter substrate according to claim 1,
    wherein each of said plurality of photoresist films is of a negative type, and
    wherein said photosensitivities of the plurality of photoresist films become smaller with proximity to said transparent substrate.

3. The method of manufacturing a color filter substrate according to claim 1,
    wherein each of said plurality of photoresist films is of a positive type, and
    wherein said photosensitivities of the plurality of photoresist films become larger with proximity to said transparent substrate.

4. The method of manufacturing a color filter substrate according claim 1,
    wherein said photomask includes a transmissive region, a light-shielding region, and a light-modulating region,
    wherein a transmittance of said light-modulating region is lower than a transmittance of said transmissive region and higher than a transmittance of said light-shielding region, and
    wherein said light-modulating region is provided along an outline, in a plan view, of each said light-shielding region and between said transmissive region and said light-shielding region.

5. The method of manufacturing a color filter substrate according to claim 4,
    wherein said opening is a first opening,
    wherein, in said step (c), a second opening is defined in addition to said first opening by the partition walls,
    wherein, in said step (d), besides said first ink being discharged, second ink of a different color from that of said first ink is discharged into the second opening, and
    wherein said light-modulating region is provided on the photomask at a location that corresponds to a first boundary between said first opening and said partition wall, and is not provided at a location that corresponds to a second boundary between said second opening and said partition wall associated thereto.

6. The method of manufacturing a color filter substrate according to claim 4,
    wherein said photomask includes a plurality of said light-modulating regions, and
    wherein transmittances of said plurality of light-modulating regions differ from one another.

7. The method of manufacturing a color filter substrate according to claim 4,
- wherein said photomask includes a plurality of said light-modulating regions, and
- wherein transmittances of said plurality of light-modulating regions are substantially the same.

8. The method of manufacturing a color filter substrate according to claim 4, wherein said light-modulating region is one of a half-tone region and a grey tone region.

9. The method of manufacturing a color filter substrate according to claim 1,
- wherein said partition walls each include a plurality of layers,
- wherein, among said plurality of layers, at least one of the layers, except that which is closest to said transparent substrate, includes a projection that projects towards said opening, and
- wherein, in said step (d), said ink is discharged until contacting a surface of said projection on a side facing said transparent substrate.

10. The method of manufacturing a color filter substrate according to claim 1,
- wherein said partition walls each include a plurality of layers,
- wherein, among said plurality of layers, a layer furthest from said transparent substrate includes a bridge portion with a cavity therebelow, and
- wherein, in said step (d), said ink is discharged until contacting a surface of said bridge portion on a side facing said transparent substrate.

11. A color filter substrate, comprising:
- a transparent substrate;
- partition walls having an opening defined therebetween on the transparent substrate; and
- a color filter formed in said opening on the transparent substrate,
- wherein said color filter and said partition walls are formed on said transparent substrate,
- wherein said partition walls each includes a plurality of layers,
- wherein each of said plurality of layers includes a cured photoresist material,
- wherein, among said plurality of layers, at least one of the layers, except that which is closest to said transparent substrate, includes a projection that projects towards said opening,
- wherein said color filter has a shape that projects upwardly away from said transparent substrate and contacts a surface of said projection on a side facing said transparent substrate, and
- wherein photosensitivities of said photoresist material included in each of said plurality of layers differ from one another.

12. The color filter substrate according to claim 11, wherein said partition walls do not include a liquid repellent.

13. The color filter substrate according to claim 11,
- wherein said opening, said color filter, and said projection are a first opening, a first color filter, and a first projection, respectively,
- wherein a second opening is further defined between said partition walls,
- wherein said color filter substrate further includes a second color filter formed in said second opening and on said transparent substrate,
- wherein said at least one of the layers that has said projection further includes a second projection that projects towards the second opening,
- wherein a color of said second color filter differs from a color of said first color filter,
- wherein said second color filter has a shape that projects upwardly away from said transparent substrate and contacts a surface of said second projection on a side facing said transparent substrate, and
- wherein a thickness of said second projection differs from a thickness of said first projection.

14. The color filter substrate according to claim 11,
- wherein said opening, said color filter, and said projection are a first opening, a first color filter, and a first projection, respectively,
- wherein a second opening is further defined between said partition walls,
- wherein said color filter substrate further includes a second color filter formed in said second opening and on said transparent substrate,
- wherein said at least one of the layers that has said projection further includes a second projection that projects towards the second opening,
- wherein a color of said second color filter differs from a color of said first color filter,
- wherein said second color filter has a shape that projects upwardly away from said transparent substrate and contacts a surface of said second projection on a side facing said transparent substrate, and
- wherein a thickness of said second projection is substantially the same as a thickness of said first projection.

15. The color filter substrate according to claim 11,
- wherein, among said plurality of layers, a layer furthest from said transparent substrate includes a bridge portion with a cavity therebelow, and
- wherein said color filter is formed in the cavity and contacts a surface of said bridge portion on a side facing said transparent substrate.

* * * * *